United States Patent [19]
Tanabe et al.

[11] Patent Number: 6,132,280
[45] Date of Patent: Oct. 17, 2000

[54] SYSTEM AND PROCESS FOR FABRICATING AN ORGANIC ELECTROLUMINESCENT DISPLAY DEVICE

[75] Inventors: Hiroshi Tanabe; Hiroshi Yamamoto; Kengo Fukuyu; Osamu Onitsuka, all of Tokyo, Japan

[73] Assignee: TDK Corporation, Tokyo, Japan

[21] Appl. No.: 09/427,763

[22] Filed: Oct. 27, 1999

[30] Foreign Application Priority Data

Oct. 28, 1998 [JP] Japan .................................. 10-322809

[51] Int. Cl.⁷ ................................................. H05B 33/10
[52] U.S. Cl. ............................................. 445/58; 445/24
[58] Field of Search ........................................ 445/24, 58

[56] References Cited

U.S. PATENT DOCUMENTS

| | | |
|---|---|---|
| 5,276,380 | 1/1994 | Tang . |
| 5,817,366 | 10/1998 | Arai et al. ................................. 427/66 |
| 6,001,413 | 12/1999 | Matsuura et al. .......................... 427/64 |
| 6,049,167 | 4/2000 | Onitsuka et al. ........................ 313/512 |

FOREIGN PATENT DOCUMENTS

| | | |
|---|---|---|
| 3-250583 | 11/1991 | Japan . |
| 3-274694 | 12/1991 | Japan . |
| 5-89959 | 4/1993 | Japan . |
| 5-275172 | 10/1993 | Japan . |
| 9-232075 | 9/1997 | Japan . |

*Primary Examiner*—Kenneth J. Ramsey
*Attorney, Agent, or Firm*—Oblon, Spivak, McClelland, Maier & Neustadt, P.C.

[57] ABSTRACT

The invention provides an organic EL display device fabrication system comprising a loading side normal-pressure delivery chamber 11 including a first substrate delivery means 61 for delivering a substrate with no film formed thereon, and a loading chamber 21 connected thereto for introducing the substrate from loading side normal-pressure delivery chamber 11 at normal pressure into a vacuum delivery chamber 31 at a vacuum. The vacuum delivery chamber 31 is connected to loading chamber 21 and includes a second substrate delivery means 62 for delivering the substrate in a vacuum, and has one or two or more film formation chambers 32 to 35 connected thereto. The system further comprises an unloading chamber 41 connected thereto for delivering the substrate out of vacuum delivery chamber 31 at a vacuum into an unloading side normal-pressure delivery chamber 51 at normal pressure. The unloading side normal-pressure delivery chamber 51 is connected to unloading chamber 41 and includes a third substrate delivery means 63 for delivering a substrate with films formed thereon. An inert gas atmosphere having a moisture content of up to 100 ppm is maintained in both unloading chamber 41 and unloading side normal-pressure delivery chamber 51 at normal pressure. The invention also provides an organic EL display device fabrication process using this fabrication system.

21 Claims, 4 Drawing Sheets

SYSTEM AND PROCESS FOR FABRICATING AN ORGANIC ELECTROLUMINESCENT DISPLAY DEVICE

BACKGROUND OF THE INVENTION

1. Art Field

The present invention relates generally to a fabrication system for fabricating an organic electroluminescent (hereinafter called organic EL for short) display device, and more specifically to a fabrication system for storing the substrate to be provided with a film, forming an organic material-containing thin film on the substrate and storing the substrate with the thin film formed thereon, and an organic EL display device fabrication process using the system.

2. Background Art

An organic EL display device comprises a matrix or other array of organic EL elements wherein light emitting elements are selectively driven to arrange characters, etc., thereby displaying information thereon. Basically, an organic EL element is built up of a tin-doped indium oxide (ITO) or other transparent hole injecting electrode (anode), a thin film form of a hole transporting material such as tetraphenyldiamine (TPD) formed as by vapor deposition on the transparent electrode, an organic light emitting layer formed of a fluorescent material such as an aluminoquinolinol complex (Alq3) and laminated on the thin film, and an electron injecting electrode (cathode) provided on the organic light emitting layer and formed of a material having a low work function, for instance, Mg. This element now attracts attention because a luminance as high as several hundred to tens of thousands $cd/m^2$ is achievable at an applied voltage of approximately 10 V. To arrange organic EL elements an a matrix or other form, for instance, JP-A 5-275172 discloses that an anode is provided on a transparent substrate, and then patterned, after which a structure rendering patterning on a cathode side possible is formed by photolithography. JP-A 5-275172 also teaches a method for forming this cathode isolation structure with a negative or positive photoresist.

In many cases, an inter-layer insulating film is provided on the anode, as set forth in JP-A's 3-250583 and 3-274694. JP-A 3-250583 discloses that the inter-layer insulating film is formed of polyimide while JP-A 3-274694 discloses a method for forming the inter-layer insulating film using a photoresist.

Thus, organic materials such as photoresists and polyimides are usually deposited on an organic EL display device substrate.

On the other hand, an organic EL display device is very sensitive to moisture. For instance, moisture has adverse influences on the organic EL display device, offering problems such as a separation between the light emitting layer and the electrode layer, and degradation of the constituting materials, which may other cause dark spots and so make it impossible to maintain light emission.

A substrate with an organic structure provided thereon adsorbs much moisture in the atmosphere. When such a substrate is immediately charged in a vacuum film formation chamber, it is required to evacuate a vacuum tank over a long period of time so as to reduce the remaining moisture therein to a sufficiently low level and then initiate film formation. It is thus required to operate a vacuum deposition system for an extended period of time, resulting in an increase in the fabrication cost of organic EL display devices.

In the fabrication process of an organic EL display device, the treatment of a substrate with films formed thereon is very important for the reason of having a close relation to the service life thereof. Usually, the substrate with films formed thereon is sealed up, as disclosed in JP-A 5-89959. When the substrate is sealed up after delivered out of a vacuum atmosphere into the atmosphere, however, it is affected by atmospheric moisture, resulting in the occurrence of display defects such as dark spots, and disadvantages such as loss of service life. With a continuous film formation system wherein substrates with films formed thereon are stored in the atmosphere as often found in a film formation system for liquid crystals, a storage time difference between substrates poses a problem in connection with the quality stability of the display device to be fabricated.

Referring here to a fabrication process of a substrate having such a structure as a cathode isolation structure or an inter-layer insulating film structure, the remnants of organic structures such as photoresists and polyimides are likely to be left on the cathode, too. When an organic EL display device is formed on a anode contaminated with the remnants, display defects such as luminance variations and dark spots are caused together with a driving voltage rise, resulting in disadvantages such as loss of service life.

For removal of atmospheric organic matters and dust deposited onto the anode, JP-A 9-232075 discloses a method of irradiating the anode with ultraviolet rays or ion beams in a vacuum tank. Only by use of irradiation with ultraviolet radiation, and ion beams, however, it is impossible to provide sufficient removal of photoresists or polyimides firmly deposited onto the anode in the substrate fabrication process. Another problem with the method set forth in JP-A 9-232075 is that some considerable expense is added to the system cost and the system running cost. Removal of organic materials may also be achieved by cleaning with ozone gas generated under reduced pressure from an ozonizer. However, it is again impossible to provide effective removal of photoresists or polyimides firmly deposited onto the anode during the substrate fabrication process.

It is therefore an object of the invention to provide a system and process for fabricating an organic EL display device with high yet stable quality and at low cost.

SUMMARY OF THE INVENTION

The above object is accomplished by the following embodiments recited below as (1) to (21).

(1) An organic EL display device fabrication system comprising:

a loading side normal-pressure delivery chamber 11 including a first substrate delivery means 61 for delivering a substrate with no film formed thereon, a loading chamber 21 connected thereto for introducing said substrate from said loading side normal-pressure delivery chamber 11 at normal pressure into a vacuum delivery chamber 31 at a vacuum, said vacuum delivery chamber 31 being connected to said loading chamber 21 and including a second substrate delivery means 62 for delivering said substrate in a vacuum, and having one or two or more film formation chambers 32 to 35 connected thereto, an unloading chamber 41 connected thereto for delivering said substrate out of said vacuum delivery chamber 31 at a vacuum into an unloading side normal-pressure delivery chamber 51 at normal pressure, said unloading side normal-pressure delivery chamber 51 connected to said unloading chamber 41 and including a third substrate delivery means 63 for delivering a substrate with films formed thereon, and an inert gas atmosphere having a moisture content of up to 100 ppm is maintained in said unloading chamber 41 and said unloading side normal-pressure delivery chamber 51, both at normal pressure.

(2) The organic EL display device fabrication system according to (1), which further comprises a loading side accommodation chamber 12, 13 connected to said loading side normal-pressure delivery chamber 11 and accommodating a plurality of substrates with no film formed thereon at normal pressure, and an unloading side accommodation chamber 52, 53 connected to said unloading side normal-pressure delivery chamber 51 aid accommodating a plurality of substrates with films formed thereon at normal pressure, with an inert gas atmosphere having a moisture content of up to 100 ppm maintained in said unloading side accommodation chamber 52, 53.

(3) The organic EL display device fabrication system according to (2), which further comprises an airtight working chamber 54 connectable to said unloading side accommodation chamber 52, 53 or said unloading side normal-pressure delivery chamber 51, with an inert gas atmosphere having a moisture content of to 100 ppm maintained in said airtight working chamber.

(4) The organic EL display device fabrication system according to (2) or 3), which further comprises a movable airtight chamber connectable to said unloading side accommodation chamber 52, 53 or said unloading side normal-pressure delivery chamber 51, with an inert gas atmosphere having a moisture content of 100 ppm maintained in said airtight working chamber.

(5) The organic EL display device fabrication system according to (2), wherein said unloading side accommodation chamber is a movable airtight chamber detachable from said unloading side normal-pressure delivery chamber 51 while an inert gas atmosphere having a moisture content of up to 100 ppm is maintained therein.

(6) The organic EL display device fabrication system according to any one of (2) to (5), wherein said loading side accommodation chamber 12, 13 is designed to heat a plurality of substrates with no film formed thereon at the same time.

(7) The organic EL display device fabrication system according to any one of (1) to (6), which further comprises a cleaning chamber 14 connected to said loading side normal-pressure delivery chamber 11 for cleaning said substrate at normal pressure, in which cleaning chamber 14 said substrate is irradiated with ultraviolet radiation and exposed to ozone.

(8) The organic EL display device fabrication system according to any one of (2) to (7), wherein in said loading chamber 21 said substrate is exposed to a reduced-pressure ozone atmosphere.

(9) The organic EL display device fabrication system according to any one of (1) to (8), wherein at least one of said film formation chambers 32 to 35 is a vacuum evaporation chamber.

(10) The organic EL display device fabrication system according to any one of (1) to (9), wherein at least one of said film formation chambers 32 to 35 is a sputtering chamber.

(11) An organic EL display device fabrication process using an organic EL display device fabrication system comprising a loading side normal-pressure delivery chamber 11 including a first substrate delivery means 61 for delivering a substrate with no film formed thereon, a loading chamber 21 connected thereto for introducing said substrate from said loading side normal-pressure delivery chamber 11 at normal pressure into a vacuum delivery chamber 31 at a vacuum, said vacuum delivery chamber 31 being connected to said loading chamber 21 and including a second substrate delivery means 62 for delivering said substrate in a vacuum, and having one or two or more film formation chambers 32 to 35 connected thereto, an unloading chamber 41 connected thereto for delivering said substrate out of said vacuum delivery chamber 31 at a vacuum into an unloading side normal-pressure delivery chamber 51 at normal pressure, an said unloading side normal-pressure delivery chamber 51 being connected to said unloading chamber 41 and including a third substrate delivery means 63 for delivering a substrate with films formed thereon, wherein:

said substrate is delivered from said vacuum delivery chamber 31 while an inert gas atmosphere having a moisture content of up to 100 ppm is maintained in said unloading chamber 41 and said unloading side normal-pressure delivery chamber 51, both at normal pressure.

(12) The organic EL display device fabrication process according to (11), wherein said organic EL display device fabrication system further comprises a loading side accommodation chamber 12, 13 connected to said loading side normal-pressure delivery chamber 11 for accommodating a plurality of substrates with no film formed thereon at normal pressure, and an unloading side accommodation chamber 52, 53 connected to said unloading side normal-pressure delivery chamber 51 for accommodating a plurality of substrates with films former thereon at normal pressure, and said substrates with films formed thereon are accommodated in said unloading side accommodation chamber 52, 53 while an inert gas atmosphere having a moisture content of up to 100 ppm is maintained in said unloading side accommodation chamber 52, 53.

(13) The organic EL display device fabrication process according to (12), wherein said organic EL display device fabrication system further comprises an airtight working chamber 54 connectable to said unloading side accommodation chamber 52, 53 or said unloading side normal-pressure delivery chamber 51, and sealing is carried out while an inert gas atmosphere having a moisture content of up to 100 ppm is maintained in said airtight working chamber.

(14) The organic EL display device fabrication process according to (12) or (13), wherein said organic EL display device fabrication system further comprises a movable airtight chamber connectable to said unloading side accommodation chamber 52, 53 or said unloading side normal-pressure delivery chamber 51, and an inert gas atmosphere having a moisture content of up to 100 ppm is maintained in said movable airtight chamber, and said movable airtight chamber is detached from said normal-pressure delivery chamber while said inert gas atmosphere having a moisture content of up to 100 ppm is maintained, so that said movable airtight chamber can be connected to airtight working chamber for delivery of said substrates with films formed thereon.

(15) The organic EL display device fabrication process according to (12), wherein said organic EL display device fabrication system has an unloading side accommodation chamber 52, 53 as a movable airtight chamber, and said movable airtight chamber is detached from said normal-pressure delivery chamber 51 while an inert gas atmosphere having a moisture content of up to 100 ppm is maintained therein, so that said movable airtight chamber can be connected to airtight working chamber for delivery of said substrates with films formed thereon.

(16) The organic EL display device fabrication process according to any one of (12) to (15), wherein in said loading side accommodation chamber 12, 13, a plurality of substrates with no film formed thereon are simultaneously heated, followed by film formation.

(17) The organic EL display device fabrication process according to (16), wherein before charged in said loading side accommodation chamber 12, 13, said substrates are irradiated with ultraviolet radiation.

(18) The organic EL display device fabrication process according to any one of (11) to (17), wherein said organic EL display device fabrication system further comprises a cleaning chamber 14 connected to said loading side normal-pressure delivery clamber 11 for cleaning said substrate at normal pressure, in which cleaning chamber 14 said substrate is irradiated with ultraviolet radiation and exposed to ozone, followed by film formation.

(19) The organic EL display device fabrication process according to any one of (11) to (18), wherein in said loading chamber 21 said substrate is exposed to a reduced-pressure ozone atmosphere.

(20) The organic EL display device fabrication process according to any one of (11) to (19), wherein in at least one of said film formation chambers 32 to 35, vacuum evaporation is carried out.

(21) The organic EL display device fabrication process according to any one of (11) to (20), wherein in at least one of said film formation chambers 32 to 35, sputtering is carried out.

EMBODIMENTS OF THE INVENTION

Figure 1:
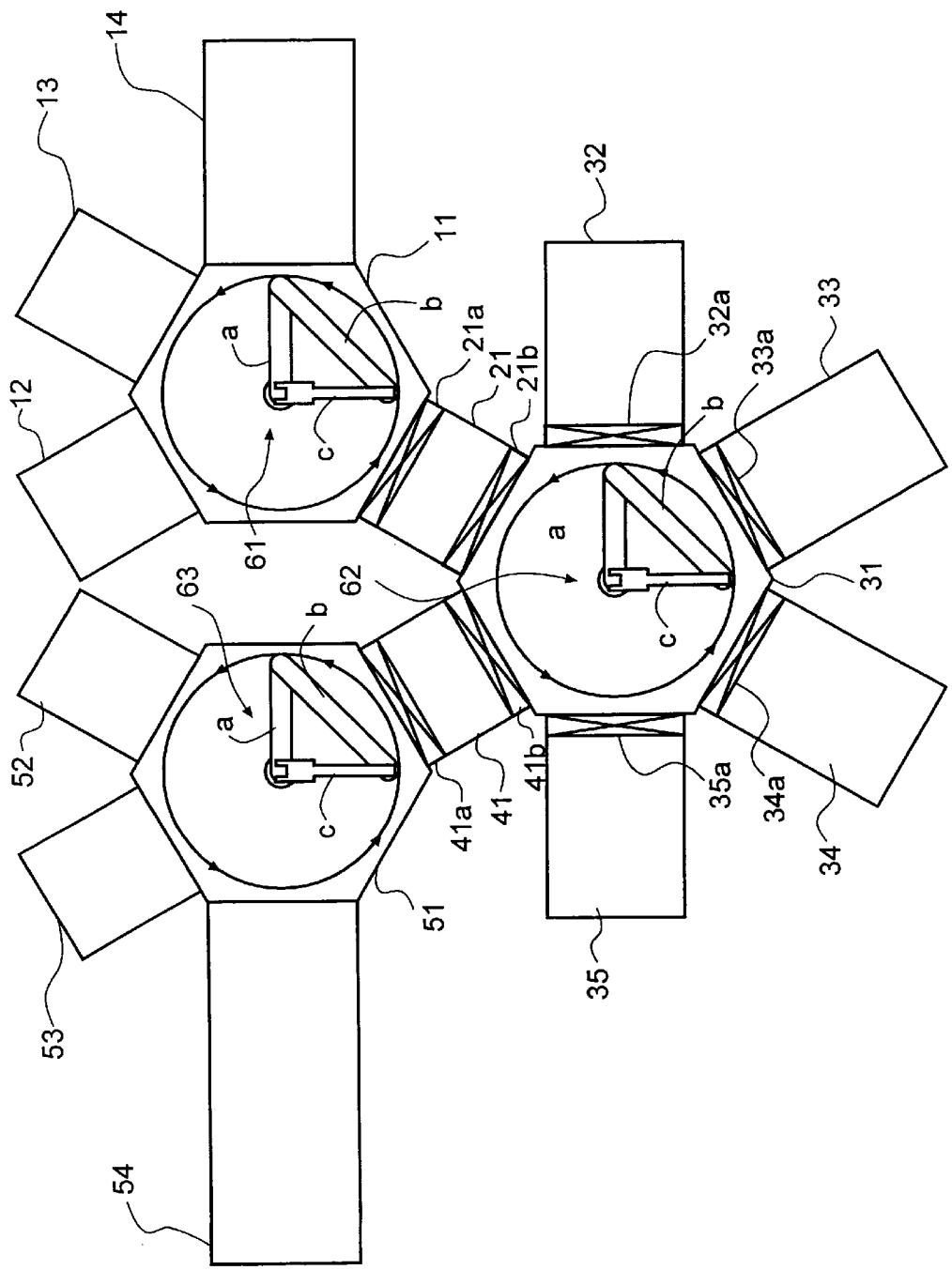
FIG. 1 is a general schematic of the basic arrangement of the organic EL display device fabrication system according to the invention.

The organic EL display device according to the invention comprises a loading side normal-pressure delivery chamber 11 including a first substrate delivery means for delivering a substrate with no film formed thereon; a loading chamber 21 connected thereto for introducing said substrate from said loading side normal-pressure delivery chamber at normal pressure into a vacuum delivery chamber at a vacuum; a vacuum delivery chamber which is connected to said loading chamber and includes a second substrate delivery means for delivering said substrate in a vacuum, and to which one or two or more film formation chambers are connected; an unloading chamber connected thereto for delivering said substrate out of said vacuum delivery chamber at a vacuum into an unloading side normal-pressure delivery chamber; and an unloading side normal-pressure delivery chamber connected to said unloading chamber and including a third substrate delivery means for delivering a substrate with films formed thereon. An inert gas atmosphere having a moisture content of up to 100 ppm is maintained in said unloading chamber and said unloading side normal-pressure delivery chamber, both at normal pressure.

By allowing the inert gas atmosphere having a moisture content of up to 100 ppm to prevail in the unloading chamber at normal pressure and the unloading side normal-pressure delivery chamber, preferably in the unloading side accommodation chamber, it is possible to prevent degradation of the device due to atmospheric oxygen or moisture, which may otherwise have an influence on display quality and service life. For the inert gas, it is preferable to use rare gases such as helium, neon and argon, and nitrogen, among which nitrogen is particularly preferred in view of handle ability and cost.

The unloading side normal-pressure delivery chamber and the unloading side accommodation chamber may be provided with a mechanical through which they are evacuated to a vacuum and the inert gas is injected thereinto. In this case, these two chambers are evacuated to a vacuum so that the inert gas cain be infected thereinto. Vacuum-drawing and the injection of the inert gas are repeated several times to increase the purity of the inert gas in these chambers up to 90 to 99.9%, preferably 99.0 to 99.9% and decrease the moisture content of the inert gas down to 100 ppm or less, preferably 10 ppm or less, and more preferably 1 ppm or less. Preferably, the moisture content should be reduced as much as possible. However, the moisture content achievable so far in the art is about 0.1 ppm. Once the desired moisture content has been reached in the inert gas atmosphere, it is preferable to circulate an inert gas having a moisture content lower than that of the inert gas atmosphere, thereby maintaining at least the reached moisture content.

The unloading side normal-pressure delivery chamber and the unloading side accommodation chamber may not be evacuated to a vacuum. In this case, an evacuation mechanism comprising the injection of an inert gas and a blower is used to inject the inert gas in the chambers while they are evacuated for atmosphere replacement. This atmosphere replacement is carried out several times to increase the purity of the inert gas up to 90 to 99.9%, preferably 99.0 to 99.9% and decrease the moisture content of the inert gas down to 100 rpm or less, and preferably 10 ppm or less. Once the atmosphere replacement has come to an end, it is preferable to circulate an inert gas having a moisture content lower than that of the inert gas atmosphere, thereby maintaining at least the achieved moisture content. However, if the moisture content of the inert gas to be circulated is reduced to a sufficiently low level, it is then possible to achieve an inert gas atmosphere having a moisture content of 1 ppm or less. Preferably, the moisture content should be reduced as much as possible. However, the moisture content achievable so far in the art is about 0.01 ppm, preferably 0.1 ppm.

As shown in FIG. 1 as an example, the organic EL display device fabrication system of the invention comprises a loading side normal-pressure delivery chamber 11 including a first substrate delivery means 61 for delivering a substrate with no film formed thereon and a loading chamber 21 connected thereto for introducing the substrate from the loading side normal-pressure delivery chamber 11 at normal pressure to a vacuum delivery chamber 31 at a vacuum. The vacuum delivery chamber 31 is connected to the loading chamber 21 and includes a second substrate delivery means 62 for delivering the substrate in a vacuum, and has one or two or more film formation chambers 32 to 35 connected thereto. Further, the system comprises an unloading chamber 41 connected to the vacuum delivery chamber 31 for delivering the substrate out of the vacuum delivery chamber 31 at a vacuum into an unloading side normal-pressure delivery chamber 51 at normal pressure. The unloading side normal-pressure delivery chamber 51 is connected to the unloading chamber 41 and includes a third substrate delivery means 63 for delivering a substrate with films formed thereon.

The pressure of the vacuum delivery chamber and the film formation chamber except during film formation, defined herein as a vacuum state, should be preferably $1 \times 10^{-3}$ Pa or less, more preferably $5 \times 10^{-4}$ Pa or less, and even more preferably $1 \times 10^{-4}$ Pa or less. The pressure of the loading chamber and the unloading chamber during evacuation should preferably 10 Pa or less, more preferably 1 Pa or less, and even more preferably 0.1 Pa or less. Although not critical, the lower limit to that pressure is usually about $10^{-6}$ Pa.

Thus, the loading side normal-pressure delivery chamber 11 for delivery, accommodation, etc. of the substrate with no film formed thereon at normal pressure, the vacuum delivery chamber 31 for moving the substrate in the film formation chambers, etc. on the loading and unloading sides under a vacuum, and the unloading side normal-pressure delivery chamber 51 for accommodation, delivery, etc. of a substrate with films formed thereon on the unloading side are independently provided and connected to one another by way of loading chamber 21 and unloading chamber 41, so that the system can be automatically run with an increased throughput. In other words, portions where film formation operations, etc. occur in a vacuum are connected to each other by war of vacuum delivery chamber 31, so that the loading chamber 21 and unloading chamber 41 can be located as buffer chambers on the loading and unloading sides where operations occur under normal pressure, thereby moving the substrate. This in turn allows the movement of the substrate between the normal-pressure atmosphere and the vacuum atmosphere to occur so smoothly that operations can occur continuously with high efficiency.

It is also preferable that the loading side normal-pressure delivery chamber 11 is provided with loading side accommodation chambers 12, 13 capable of accommodating a plurality of substrates therein and the unloading side normal-pressure delivery chamber 51 is provided with unloading side accommodation chambers 52, 53 capable of accommodating a plurality of substrates therein, thereby achieving much more increased throughputs. A loading side accommodation chamber 12, 13 is connected to said loading side normal-pressure delivery chamber 11 and accommodates a plurality of substrates with no film formed. And an unloading side accommodation chamber 52, 53 is connected to said unloading side normal-pressure delivery chamber 51 and accommodates a plurality of substrates with films formed. Although the number of substrates to be accommodated in the accommodation chambers on the loading and unloading sides is not limited, it is preferred to accommodate at least five substrates, especially at least ten substrates in each chamber. Although no upper limit is placed to the number of substrates to be accommodated, about 40 substrates are usually received in each chamber.

The delivery chambers 11, 31 and 51 are provided therein with robot atoms 61, 62 and 63 serving as the first, second and third delivery means, respectively. The delivery means are not limited to such robot arms; they may be constructed of combinations of various known delivery means, for instance, a belt delivery device, a pitch feed delivery device, and a handling device. The robot arms 61, 62 and 63 deliver organic EL display device substrates 5 and insert or remove them into or from the accommodation chambers 12, 13, 52 and 53. For instance, each robot includes three arms a, b and c. These arms a, b and c form together a so-called articulated robot wherein according to the degree of freedom defined by the respective articulated joints, a holder d at the extreme end of the arm c is vertically or horizontally movable to any desired position, thereby holding and moving the substrate.

Figure 2:
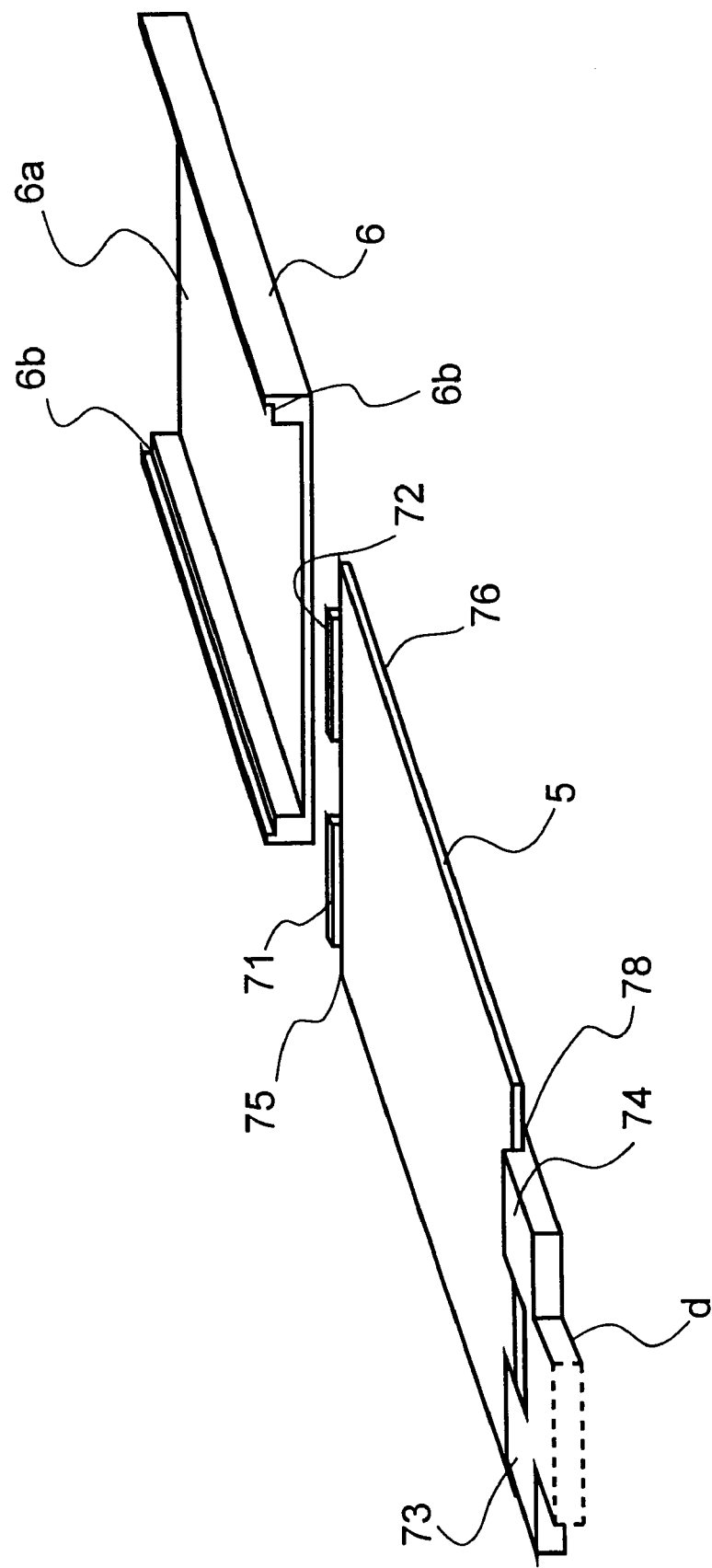
FIG. 2 is a partly perspective view showing relations between the holder and supporting base of the robot arm.
Figure 3:
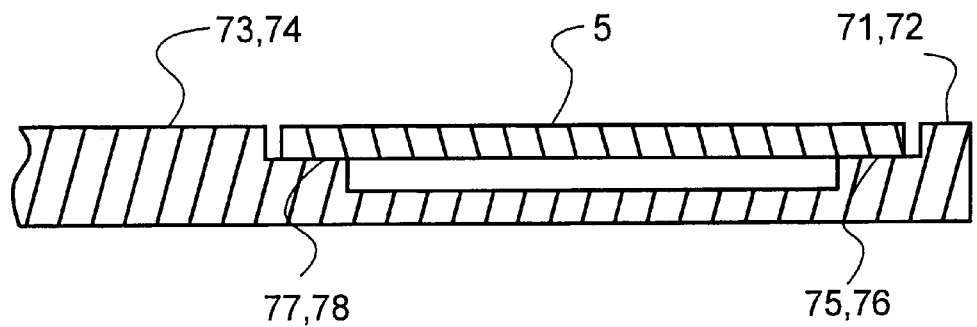
FIG. 3 is a partly sectioned view showing relations between the holder and supporting base of the robot arm.

As shown in FIGS. 2 and 3, the holder d receives and holds an organic EL display device substrate 5, and is provided at four positions with four protruding portions 71, 72, 73, 74 and four step portions 75, 76, 77, 78 for receiving and holding the substrate 5.

A supporting base 6, on which the organic EL display device substrate 5 is to be placed, is C-shaped in section to define a recess 6a slightly larger than the substrate 5, as shown in FIG. 2. In FIG. 2, the holder d of the robot arm 61, 62 or 63 moves in the right direction, so that the protruding portions 71 and 72 are inserted over the supporting base 6. At this time, the lower surface of the substrate 5 is inserted over the supporting base with a height slightly larger than the step of the step portion 6b, so that the substrate 5 can move as such over the step portion 6b of the supporting base 6. Upon the substrate reaching a predetermined position, the holder d goes down or the supporting base 6 goes up, so that the substrate 5 is placed over a predetermined position on the supporting base 6 while it is supported by the step portion 6b. At this time, the height of the step portion 6b is slightly larger than the thicknesses of the holder d and protruding portions 71, 72, so that the holder d and protruding portions 71, 72 can be pulled from between the substrate 5 and the supporting base 6.

In the loading chamber 21 and unloading chamber 41, the substrate moves as follows. First, the robot arm 61 in the loading side normal-pressure delivery chamber 11 places the substrate with no film formed thereon in the loading chamber 21. At this time, a gate valve 21a in the loading chamber 21, which valve is or the side of the loading side normal-pressure working chamber 11, is at an open position while a gate valve 21b on the side of the vacuum delivery chamber 31 is at a close position. As the robot arm 61 moves upon the substrate placed in the loading chamber 21, the gate valve 21a on the side of the loading side normal-pressure working chamber 11 closes while the gate valve 21b on the side of the vacuum delivery chamber 31 opens. Then, the robot arm 62 on the side of the vacuum delivery chamber 31 is actuated to hold the substrate, and moves to a given film formation chamber. At this time, the loading chamber 21 may be evacuated to a vacuum before the opening of the gate valve 21b on the side of the vacuum delivery chamber 31. Alternatively, the vacuum delivery chamber 31 may be further evacuated after the opening of the gate valve 21b.

The movement of the substrate from the vacuum delivery chamber 31 to the unloading side normal-pressure delivery chamber 51 occurs in the reverse sequence. That is, the robot arm 62 in the vacuum delivery chamber 31 places the substrate with films formed thereon in the unloading chamber 41. At this time, a gate valve 41a in the unloading chamber 41, which valve is on the side of the unloading side normal-pressure delivery chamber 51, is at a close position while a gate valve 41b on the side of the vacuum delivery chamber 31 is at an open position. It is then preferable that upon the opening of the gate valve 41b on the side of the vacuum delivery chamber 31, the unloading chamber 41 has already been evacuated by an evacuator to a vacuum state similar to that in the vacuum delivery chamber 31. At this time, the unloading chamber 41 may be evacuated to a vacuum upon the opening of the gate valve 41b on the side of the vacuum delivery chamber 31. Alternatively, the vacuum delivery chamber 31 may be further evacuated after the opening of the gate valve 41b. As the robot arm 62 moves upon the substrate placed in the unloading chamber 41, the gate valve 41b on the side of the vacuum delivery chamber 31 closes while the gate valve 41a on the side of the unloading side normal-pressure delivery chamber 51 opens. Then, the robot arm 63 on the unloading side normal-pressure delivery chamber 51 is actuated to hold the substrate, and moves to the accommodation chamber 52, 53 or the airtight working chamber 54.

Thus, the delivery of the substrate between the vacuum side and the normal pressure side occurs by way of the loading chamber 21 and unloading chamber 41, so that the substrate can be delivered without breaking the vacuum state in the vacuum delivery clamber 31, thereby making continuous fabrication feasible.

The vacuum delivery chamber 31 is provided at its peripheral wall with a cluster array of film formation chambers 32 to 35 which communicate with one another by way of gate valves 32a to 35a. The gate valves 32a to 35a are provided to keep the internal atmospheres in the respective film formation chambers 32 to 35 at given states; they ensure airtightness during film formation operations, etc., and are closeable or openable so as to make the substrate movable after the completion of film formation.

No particular limitation is imposed on how to form films in a plurality of film formation chambers. For film formation a vacuum evaporation process is usually employed. By altering control methods, it is possible to treat a plurality of substrate side by side while similar film formation chambers are arranged side by side. If the film formation chambers are separated in the order of lamination, it is then possible to treat a plurality of substrate in a sequence manner. In addition to the vacuum evaporation process, use may be made of a sputtering process, an ion plating process, a CVD process, etc. Alternatively, a system suitable for combinations of these processes may be set out. Although no particular limitation is imposed on the number of film formation chambers, it is preferable that film formation chambers for organic materials are provided separately from those for metals. In this case, at least two film formation chambers are needed. Each film formation chamber communicates with the loading and unloading chambers by way of the vacuum delivery chamber. Usually, the vacuum delivery chamber is provided therearound with a total of about eight chambers, i.e., about six film formation chambers at most. If the degree of flexibility in various multilayer structures and the operating efficiency of the system are taken into consideration, then the number of film formation chambers should preferably be at least 4.

As already mentioned, the substrate is delivered from the vacuum delivery chamber 31 to the unloading chamber 41 while it is in a vacuum state. After this, the gate valve 41b located between the unloading chamber 41 and the vacuum delivery chamber 31 is closed to feed an inert gas having a purity of 90 to 99.9%, preferably 99.0 to 99.9% and a moisture content of 100 ppm o less, preferably 10 ppm or less, and more preferably 1 ppm or less to the unloading chamber 41, thereby keeping the interior of the chamber 41 at normal pressure. The atmosphere in the chamber after kept at normal pressure is substantially equal in terms of purity and moisture content to the supplied inert gas.

In the organic EL display device fabrication system according to the invention, an airtight working chamber 54 may be connected to the unloading side normal-pressure delivery chamber 51. In this case, the airtight working chamber 54 may be connected directly or via a movable airtight chamber to the unloading side normal-pressure delivery chamber 51. In this airtight working chamber 54, too, an inert gas atmosphere having a purity of 90 to 99.9%, preferably 99.0 to 99.9% and a moisture content of 100 ppm or less, preferably 10 ppm or less, and more preferably 1 ppm or less is maintained as is the case with the unloading side normal-pressure delivery chamber 51 or the unloading side accommodation chamber 52, 53.

In the thus connected airtight working chamber 54, the substrate with films formed thereon is primarily sealed up. Usually, such an airtight working chamber 54 comprises an airtight pre-chamber and a working chamber, although the airtight pre-chamber may be dispensed with. If required, a plurality of working chambers may be provided optionally with an airtight post-chamber. Usually, the number of working chambers is about 1 to 3.

When the airtight working chamber 54 is connected directly to the unloading side normal-pressure delivery chamber 51, the unloading side normal-pressure delivery chamber 51 should preferably be connected to the working chamber or airtight pre-chamber. In this case, the delivery means 63 which the unloading side normal-pressure delivery chamber 51 includes may be used as the substrate feed means with respect to the airtight working chamber 54, so that the substrate can be delivered in a sheet form. In this case, it is preferable to deliver the substrate using the substrate delivery means on the side of the airtight working chamber 54 or deliver a cassette with the substrate received therein.

When the airtight working chamber 54 is connected to the unloading side normal-pressure delivery chamber 51 via the movable airtight chamber, it is desired that a plurality of substrates, preferably at least 5 substrates, and more preferably at least 10 substrates be accommodated in the movable airtight chamber. Although no particular upper limit is imposed to the number of the substrates to be accommodated, about 40 substrates are usually received in the movable airtight chamber. Preferably, the movable airtight chamber should be connected to the unloading side normal-pressure delivery chamber 51. In this case, the delivery means 63 which the unloading side normal-pressure delivery chamber 51 includes may be used to deliver the substrate to the movable airtight chamber. Alternatively, the movable airtight chamber may be connected to the unloading side accommodation chamber 52, 53. In this case, it is preferable to deliver a cassette with the substrate received therein to the movable airtight chamber. The unloading side accommodation chamber 52, 53 may form a movable airtight chamber detachable from the unloading side normal-pressure delivery chamber 51.

In any case, an inert gas atmosphere having a purity of 90 to 99.9%, preferably 99.0 to 99.9% and a moisture content of 100 ppm or less, preferably 10 ppm or less, and more preferably 1 ppm or less is maintained in the movable airtight chamber as is the case with the unloading side normal-pressure delivery chamber 51 or the unloading side accommodation chamber 52, 53 while the movable airtight chamber is connected to the unloading side normal-pressure delivery chamber 51 or the unloading side accommodation chamber 52, 53. After detached from the associated chamber, the movable airtight chamber maintains its internal atmosphere through a closed structure. Upon receipt of the substrate with films formed thereon, the movable airtight chamber moves to the airtight working chamber positioned at a different place, and is then connected thereto for delivery of the substrate. Usually but not exclusively, the movable airtight chamber is moved by a worker or an automated guided vehicle (AGV) which runs in an automated manner. In this case, too, an inert gas atmosphere having a purity of 90 to 99.9%, preferably 99.0 to 99.9% and a moisture content of 100 ppm or less, preferably 10 ppm or less, and more preferably 1 ppm or less is maintained in the movable airtight chamber as is the case with the unloading side normal-pressure delivery chamber 51 or the unloading side accommodation chamber 52, 53, while the movable airtight chamber is connected to the airtight working chamber.

Figure 4:
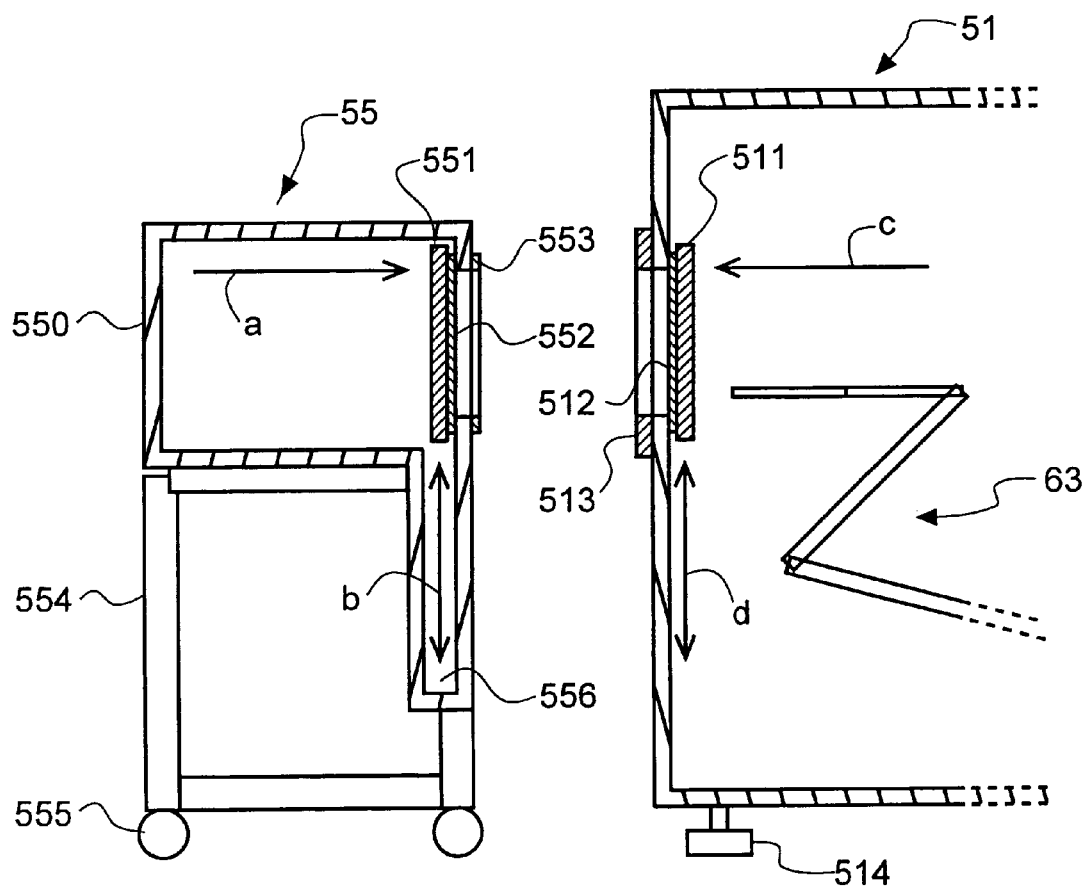
FIG. 4 is a partly sectioned view showing a detailed exemplary arrangement of the movable airtight chamber and unloading side normal-pressure delivery chamber when the movable airtight chamber is not connected to the unloading side normal-pressure delivery chamber.
Figure 5:
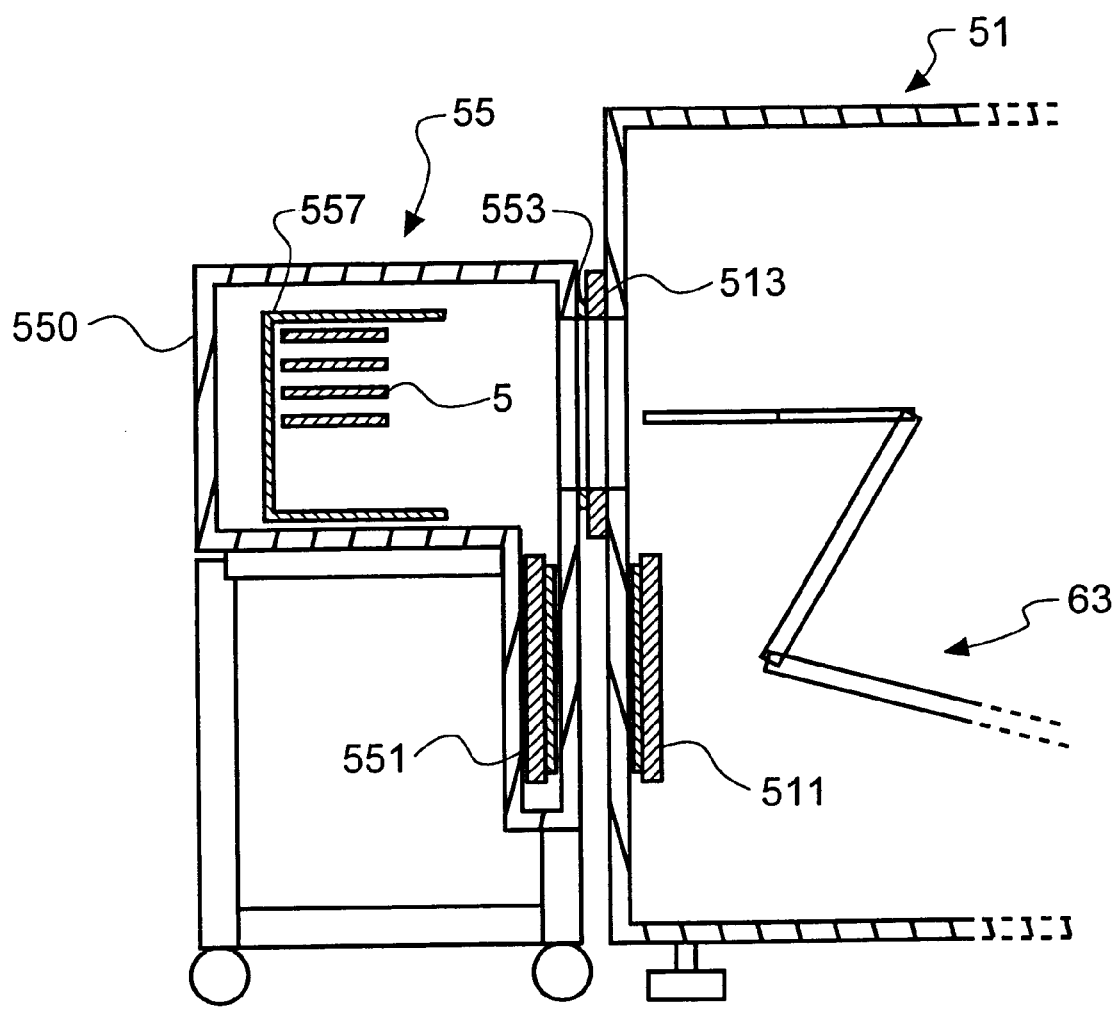
FIG. 5 is a partly sectioned view showing a detailed exemplary arrangement of the movable airtight chamber and unloading side normal-pressure delivery chamber when the movable airtight chamber is connected to the unloading side normal-pressure delivery chamber.

One exemplary arrangement of the movable airtight chamber is shown in FIG. 4. As shown in FIG. 4, a movable airtight chamber 55 comprises an airtight chamber 550, a pedestal 554 on which the airtight chamber 550 is supported, and wheel carriers attached to the pedestal 554. The airtight chamber 550 includes an airtight door 551 attached to an opening in an openable manner. The airtight chamber 550 further includes a door receiver 556 for receiving the airtight door 551 when it is opened. The airtight door 551 is movable in a direction indicated by an arrow b when it is opened or closed. The airtight door 551 is provided with a packing 552 which, upon the airtight door 551 closed, is forced in a direction indicated by an arrow a to maintain airtightness in the airtight chamber 550. In addition, the opening in the airtight chamber 550 is provided therearound with a packing 553 which ensures airtightness around the opening when the movable airtight chamber 55 is connected to the unloading side normal-pressure chamber 51.

It is here noted that between the airtight chamber 550 and the pedestal 554 there is provided a height control mechanism (not shown) for controlling the height of the airtight chamber 550. With this height control mechanism, the airtight working chamber 54 can be controlled in terms of height with respect to the unloading side normal-pressure delivery chamber 51 or the unloading side accommodation chamber 52, 53 for proper connection thereto. To this end, use may be made of commonly used height control mechanisms, for instance, a lift mechanism comprising arms combined together in a pantograph configuration, a height control mechanism making direct use of screws ball screws, etc., and a height control mechanism making use of a hydraulic cylinder, etc.

A packing between the movable airtight chamber 55 and the unloading side normal-pressure delivery chamber 51 should preferably be formed of a relatively soft material that can absorb differences in parallelism between both chambers while airtightness is ensured. For such a packing, for instance, use may be made of silicone rubber O-rings, and silicone foamed sponges.

On the other hand, the unloading side normal-pressure delivery chamber 51 to which the movable airtight chamber 55 is connected is provided in a position corresponding to the opening in the airtight chamber 550 with a similar opening. As in the case of the airtight chamber 550, an airtight door 511 having a packing 512 is forced in a direction indicated by an arrow c to maintain airtightness, while it is movable in a direction indicated by an arrow d when opened or closed. Around the aforesaid opening there is located a connecting member 513 for ensuring connection to the movable airtight chamber.

With the movable airtight chamber 55 connected to the unloading side normal-pressure delivery chamber 51 as shown in FIG. 4, the respective airtight doors 551 and 511 are opened, after which they move down so that the substrate 5 can move easily between both through a window portion. At this time, the movable airtight chamber 55 is forced toward the unloading side normal-pressure delivery chamber 51, and so the packing 553 around the airtight chamber is forcibly engaged with the connecting member 513 to ensure airtightness around the window portion. Then, the substrate 5 with films formed thereon is delivered by the delivery means 63 and inserted in a substrate cassette 557 located in the airtight chamber 550, after which the airtight doors 551, 511 are closed for detachment of both chambers. Thus, the interior of the airtight chamber 550 is kept in the same state as the internal atmosphere of the unloading side normal-pressure delivery chamber 51. It is here noted that if the wheel carriers 555 are connected to a power source, then they can be set out as a self-running type.

By connecting the airtight working chamber directly or by way of the movable airtight chamber to the organic EL display device fabrication system of the invention, it is thus possible to deliver the substrate to the airtight working chamber without breaking the inert gas atmosphere having a moisture content of 100 ppm, where the substrate can be sealed up, resulting in the achievement of stabilized display quality and service life.

In the organic EL display device fabrication system of the invention, several substrates may be heated at the same time in the loading side accommodation chamber 12, 13. By heating the substrates, it is possible to deprive the substrate or an organic structure thereon of moisture adsorbed therein. The then proper heating temperature is usually about 80° C. to about 200° C., although varying with the storage state of the substrate. Given the heat resistance and dehydration effects of the substrate, the heating temperature should be preferably 100° C. to 180° C., and more preferably 120° C. to 150° C. The lower limit to the holding time for heating is usually at least 5 minutes, although varying with the storage state and heating time of the substrate. In view of dehydration consideration, however, the holding time is preferably at least 10 minutes, and more preferably at least 20 minutes. In view of quality consideration, there is no particular upper limit to the holding time for heating. If the throughput of the system is taken into account, however, it is then preferable that the holding time is usually about 1,440 minutes or shorter, especially 720 minutes or shorter, and more especially 480 minutes or shorter. To enhance the dehydration effect, the heating time should be as long as possible. By the simultaneous heat treatment of a plurality of substrates, however, it is possible to keep the overall throughput of the system high.

The organic EL display device fabrication system of the invention may further comprises a cleaning chamber 14 connected to the loading side normal-pressure delivery chamber 11 for cleaning a substrate at normal pressure. In the cleaning chamber, the substrate may be irradiated with ultraviolet rays and, at the same time, exposed to ozone. Preferably but not exclusively, the ultraviolet radiation should have a wavelength of 150 nm to 300 nm, especially 160 nm to 200 nm or 240 nm to 260 nm. The exposure dose should be 500 mJ/cm$^2$ to 25,000 mJ/cm$^2$, preferably 2,000 mJ/cm$^2$ to 20,000 mJ/cm$^2$, and more preferably 3,000 mJ/cm$^2$ to 15,000 mJ/cm$^2$, as measured with an illumination meter calibrated at 254 nm wavelength. Equipment capable of such ultraviolet irradiation, for instance, includes a low-pressure mercury lamp. As measured with an illumination meter calibrated at 185 nm wavelength, the exposure dose should be 10 mJ/cm$^2$ to 5,000 mJ/cm$^2$, preferably 50 mJ/cm$^2$ to 3,000 mJ/cm$^2$, and more preferably 100 mJ/cm$^2$ to 2,000 mJ/cm$^2$. Equipment capable of such ultraviolet irradiation, for instance, includes a dielectric barrier discharge excimer lamp. Alternatively, the substrate may be exposed to ozone obtained by the ozonization by ultraviolet irradiation of atmospheric oxygen or oxygen introduced into the cleaning chamber. Still alternatively, the substrate may be exposed to ozone which is generated by an ozonizer and introduced into the cleaning chamber. By the irradiation of the substrate with ultraviolet radiation having the aforesaid wavelength, free radicals of contaminants are generated. From ozone, on the other hand, atomic oxygen is generated. This oxygen then reacts with the free radicals to generate a vapor phase, which is in turn removed from the surface of the substrate. By irradiating the substrate with ultraviolet radiation and, at the same time, exposing the substrate to ozone, it is thus possible to achieve effective removal of the remnants of polyimide, photoresist, etc.

In the organic EL display device fabrication system of the invention, the substrate may also be exposed to a reduced-pressure ozone atmosphere in the loading chamber. By exposing the substrate to the reduced-pressure ozone atmosphere in the loading chamber, it is possible to achieve removal of organic materials deposited on the substrate during storage or delivery. In this case, the ozone may be supplied from an ozonizer, or the substrate may be irradiated with ultraviolet radiation with the supply of oxygen gas.

The ozone should be fed at a concentration of preferably at least 50 g/m$^3$. more preferably at least 100 g/m$^3$, and even more preferably 150 g/m$^3$. The upper limit to this concentration is usually about 200 g/m$^3$, although the invention is not limited thereto. The ozone may be generated by various means. For instance, ozone may be generated by inserting a dielectric material between a pair of electrodes, applying a high-voltage current between the electrodes, and passing oxygen through the resulting discharge space.

Preferably but not exclusively, the substrate should be irradiated with ultraviolet radiation having a wavelength of 150 nm to 300 nm, and especially 240 nm to 260 nm. The exposure dose should be 500 mJ/cm$^2$ to 25,000 mJ/cm$^2$, preferably 3,000 mJ/cm$^2$ to 20,000 mJ/cm$^2$, and more preferably 3,000 mJ/cm$^2$ to 15,000 mJ/cm$^2$, as measured with an illumination meter calibrated at 254 nm wavelength. Equipment capable of such ultraviolet irradiation, for instance, includes a low-pressure mercury lamp.

In the organic EL display device fabrication system of the invention, the substrate is heated in the loading side accommodation chamber. When the substrate is irradiated with ultraviolet radiation in this case, no particular limitation is imposed on the wavelength of ultraviolet radiation. Preferably, however, the ultraviolet radiation should have a wavelength of 250 nm to 450 nm, and especially 300 nm to 400 nm. The exposure dose should be preferably 500 mJ/cm$^2$ to 15,000 mJ/cm$^2$, and more preferably 1,000 mJ/cm$^2$ to 10,000 mJ/cm$^2$, as measured with an illumination meter calibrated at 365 nm wavelength. By irradiating the substrate with ultraviolet radiation, it is possible to accelerate the crosslinking of the organic structure of photoresist, etc. on the substrate, thereby preventing thermal deformation of the substrate during heating.

EXAMPLE

Example 1

An ITO transparent electrode (hole injecting electrode) was formed at a film thickness of 85 nm on a glass substrate of 365 mm×460 mm. Then, 40 display device patterns, each forming 256×64 pixels (300 μm×300 μm per pixel), were provided by patterning on the substrate. In this case, the contour of each pixel was formed by providing an opening of pixel size in an inter-layer insulating film formed of photo-sensitive polyimide. A wall formed of a positive photoresist and including an overhang was formed on the inter-layer insulating film to obtain a structure for isolation of an electron injecting electrode side. Then, the stack was irradiated by a high-pressure mercury lamp with ultraviolet radiation at a dose of 5,000 mJ/cm$^2$ as Measured at 365 nm wavelength.

Ten substrates, each prepared as mentioned above, were set in the loading side accommodation chamber in the film formation system, wherein they were heated at a temperature of 150° C. for 60 minutes. Following this, the first substrate was delivered to the cleaning chamber, wherein the substrate was irradiated by a low-pressure mercury lamp and in the air atmosphere with ultraviolet radiation at a dose of 5,000 mJ/cm$^2$ as measured at 254 nm wavelength. In this case, the substrate was exposed to ozone generated by ultraviolet radiation. After cleaned with UV/O$_3$, the substrate was delivered to the organic evaporation chamber via the loading chamber, which was then evacuated to 1×10$^{-4}$ Pa or lower. Following this, m-MTDATA was deposited by evaporation on the substrate to a thickness of 40 nm at a deposition rate of 0.2 nm/sec. to obtain a hole injecting layer. While the reduced pressure was maintained, TPD was then deposited by evaporation on the hole injecting layer to a thickness of 35 nm at a deposition rate of 0.2 nm/sec. to obtain a hole transporting layer. Subsequently, while the reduced pressure was kept, Alq3 was deposited by evaporation on the hole transporting layer to a thickness of 50 nm at a deposition rate of 0.2 nm/sec. to obtain a combined electron injecting/transporting and light emitting layer. Subsequently, while the reduced pressure was maintained, MgAg was deposited by co-evaporation (binary evaporation) to a thickness of 200 nm at a deposition rate ratio of MgAg=1:10, thereby obtaining an electron injecting electrode. In addition, while the reduced pressure was maintained, the substrate was delivered to the sputtering chamber, wherein an Al protective electrode was deposited to a thickness of 200 nm at a sputtering pressure of 0.3 Pa, using a DC sputtering process with an Al target. For this sputtering, Ar was used as the sputtering gas, with an input power of 5 kW, a target size of 600 mm×700 mm, and a distance of 100 mm between the substrate and the target.

On the other hand, the atmospheres in the unloading side normal-pressure delivery chamber 51 and the unloading side accommodation chamber 52, 53 were provided as follows. These two chambers were evacuated to a vacuum and a N$_2$ gas was injected therein as an inert gas. Vacuum drawing and the injection of the inert gas were repeated three times. The inert gas in each chamber was found to have a purity of 99.9% and a moisture content of 10 ppm.

The substrate with films formed thereon was delivered to the unloading side accommodation chamber 52, 53 by way of the unloading chamber 41 and unloading side normal-pressure delivery chamber 51. To change the unloading chamber from the vacuum to normal pressure, a N$_2$ gas having a moisture content of 10 ppm and a purity of 99.9% was used.

The second and subsequent substrates were successively treated as in the case of the first substrate. At this time, the cycle tine was 15 minutes. The substrate-depending heating time in the loading side accommodation chamber 12, 13 was 60 minutes for the first substrate, . . . and 195 minutes for the tenth substrate.

Then, the unloading side accommodation chamber 52, 53 was detached from the unloading side normal-pressure delivery chamber 51 to transfer ten substrates to the airtight working chamber 54 while the $N_2$ atmosphere having a moisture content of 10 ppm and a purity of 99.9% was kept intact. In the airtight working chamber 54, sealing glass sheets were bonded and sealed to all display device patterns on the ten substrates, using a bonding agent and a spacer of given size. Finally, the substrates were removed from the airtight working chamber, and the display device patterns were cut therefrom.

Example 2

An organic EL display device was prepared as in Example 1 with the exception that in the loading chamber the substrate was exposed for 5 minutes to ozone generated from an ozonizer. $O_2+N_2$ gases were used for the starting gases, with an $O_2$ gas flow rats of 1 NL/min. and a $N_2$ gas flow rate of 10 NCC/min. At this time, the atmospheric pressure in the cleaning chamber was $6.65 \times 10^3$ Pa.

Example 3

An organic EL display device was prepared as in Example 1 with the exception that to provide atmospheres in the unloading side normal-pressure delivery chamber and unloading side accommodation chamber, atmosphere replacement was continuously carried out by evacuating the chambers at a flow rate of 1 m³/hour by means of a blower while a $N_2$ gas was fed thereto at a flow rate of 1 m³/hour, thereby obtaining a $N_2$ atmosphere having a moisture content of 10 ppm and a purity of 99.9%.

Example 4

An organic EL display device was prepared following Example 1 with the exception that before the substrate was set in a film formation system, it was heated at 150° C. for 60 minutes in a clean oven, and then set in the loader side accommodation chamber 12, 13 in the film formation system, wherein heating was rot effected.

Example 5

An organic EL display device was prepared following Example 1 with the exception that the substrate was not washed with $UV/O_3$ in the cleaning chamber and, instead, it was washed with UV in one chamber of vacuum film formation chambers, to which ar UV irradiator was attached.

Example 6

An organic EL display device was prepared following Example 1 with the exception of ultraviolet irradiation using a high-pressure mercury lamp.

Example 7

This example was carried out following Example 1 with the exception that the moisturet content of $N_2$ gas used as the inert gas was regulated to the range of 10 ppm to 100 ppm inclusive, and display quality was estimated as in Examples 1 to 6.

As a result, the sample according to this example showed a display quality of 85% or greater.

Example 8

This example was carried out following Example 1 with the exception that the moisture content of $N_2$ gas used as the inert gas was regulated to 1 ppm by removal of moisture using a gas purifier, and display quality was estimated as in Examples 1 to 6.

As a result, the sample according to this example had a very satisfactory display quality of 95% or greater.

Comparative Example 1

An organic EL display device was prepared following Example 1 with the exception that air atmospheres were provided in the unloading side normal-pressure chamber and unloading side accommodation chamber.

Organic EL display devices cut from the first and tenth substrates were sampled out of the organic EL display devices prepared in Examples 1 to 6 and Comparative Example 1. These devices were continuously driven at a constant current density of 10 mA/cm² with the application of direct-current voltage thereto in the air atmosphere. In all cases, green light was emitted with a light emission maximum wavelength of λmax=520 nm. The driving voltage and luminance in the initial stage of light emission as well as the quarter-life of luminance were measured. In addition, the display quality in the initial stage of light emission and the occurrence of dark spots during continuous driving were observed. The results are indicated in Table 1. The initial display quality was determined in terms of how many non-defective devices were included in organic EL display devices cut out of one substrate. By the "non-defective device" used herein is intended a device free from dark spots of 100 μm or greater in size and having no luminance variation of 20% or greater in one pixel or between pixels. The dark spot was estimated according to the following criteria.

The symbol ⊚ indicates that dark spots of 100 μm or greater in diameter were not found even after the lapse of 3,000 hours. The symbol ○ indicates that dark spots of 100 μm or greater in diameter were not found even after lapse of 2,000 hours. The symbol Δ indicates that dark spots of 100 μm or greater in diameter were found within as short as 1,000 hours. The symbol indicates that dark spots of 100 μm or greater in diameter were found within barely 100 hours.

TABLE 1

| Example No. | Sampling site | Driving voltage (v) | Initial luminance (cd/m²) | Quarter-life (h) | Display quality (%) | Dark spots |
|---|---|---|---|---|---|---|
| 1 | first | 8.0 | 510 | >3000 | >90 | ⊚ |
|  | tenth | 8.0 | 510 | >3000 | >90 | ⊚ |
| 2 | first | 7.8 | 510 | >3000 | >90 | ⊚ |
|  | tenth | 7.8 | 510 | >3000 | >90 | ⊚ |
| 3 | first | 8.0 | 510 | >3000 | >90 | ⊚ |
|  | tenth | 8.0 | 510 | >3000 | >90 | ⊚ |
| 4 | first | 8.1 | 500 | >3000 | >90 | ○ |
|  | tenth | 8.5 | 460 | >2500 | >90 | ○ |
| 5 | first | 8.3 | 500 | >3000 | 70 | ○ |
|  | tenth | 8.3 | 500 | >3000 | 70 | ○ |
| 6 | first | 8.0 | 510 | >3000 | 65 | ⊚ |
|  | tenth | 8.0 | 510 | >3000 | 50 | ⊚ |
| 7 | first | 8.0 | 510 | >3000 | 85 | ⊚ |
|  | tenth | 8.0 | 510 | >3000 | 85 | ⊚ |
| 8 | first | 8.0 | 510 | >3000 | >95 | ⊚ |
|  | tenth | 8.0 | 510 | >3000 | >95 | ⊚ |
| Comp. 1 | first | 8.3 | 460 | >1000 | 60 | x |
|  | tenth | 8.1 | 480 | >2000 | 70 | Δ |

ADVANTAGES OF THE INVENTION

According to the present invention as detailed above, it is possible to achieve a fabrication system and process for fabricating at low cost an organic EL display device having high yet stabilized quality.

Japanese Patent Application No. 10-322809 is herein incorporated by reference.

The structures and processes illustrated and described herein illustrate the principles of the invention. Modifications to the illustrated embodiments may be made without departing from the spirit and scope of the invention. Therefore the present invention includes the subject matter defined by the appended claims and all reasonable equivalents.

What is claimed is:

1. An organic EL display device fabrication system comprising:
    a loading side normal-pressure delivery chamber including a first substrate delivery means for delivering a substrate with no film formed thereon,
    a loading chamber connected thereto for introducing said substrate from said loading side normal-pressure delivery chamber at normal pressure into a vacuum delivery chamber at a vacuum,
    said vacuum delivery chamber being connected to said loading chamber and including a second substrate delivery means for delivering said substrate in a vacuum, and having one or two or more film formation chambers connected thereto,
    an unloading chamber connected thereto for delivering said substrate out of said vacuum delivery chamber at a vacuum into an unloading side normal-pressure delivery chamber at normal pressure,
    said unloading side normal-pressure delivery chamber being connected to said unloading chamber and including a third substrate delivery means for delivering a substrate with films formed thereon, and
    an inert gas atmosphere having a moisture content of up to 100 ppm is maintained in said unloading chamber and said unloading side normal-pressure delivery chamber, both at normal pressure.

2. The organic EL display device fabrication system according to claim 1, which further comprises a loading side accommodation chamber connected to said loading side normal-pressure delivery chamber and accommodating a plurality of substrates with no film formed thereon at normal pressure, and an unloading side accommodation chamber connected to said unloading side normal-pressure delivery chamber and accommodating a plurality of substrates with films formed thereon at normal pressure, with an inert gas atmosphere having a moisture content of up to 100 ppm maintained in said unloading side accommodation chamber.

3. The organic EL display device fabrication system according to claim 2, which further comprises an airtight working chamber connectable to said unloading side accommodation chamber or said unloading side normal-pressure delivery chamber, with an inert gas atmosphere having a moisture content of up to 100 ppm maintained in said airtight working chamber.

4. The organic EL display device fabrication system according to claim 2, which further comprises a movable airtight chamber connectable to said unloading side accommodation chamber or said unloading side normal-pressure delivery chamber, with an inert gas atmosphere having a moisture content of up to 100 ppm maintained in said airtight working chamber.

5. The organic EL display device fabrication system according to claim 2, wherein said unloading side accommodation chamber is a movable airtight chamber detachable from said unloading side normal-pressure delivery chamber while an inert gas atmosphere having a moisture content of up to 100 ppm is maintained therein.

6. The organic EL display device fabrication system according to claim 2, wherein said loading side accommodation chamber is designed to heat a plurality of substrates with no film formed thereon at the same time.

7. The organic EL display device fabrication system according to claim 1, which further comprises a cleaning chamber connected to said loading side normal-pressure delivery chamber for cleaning said substrate at normal pressure, in which cleaning chamber said substrate is irradiated with ultraviolet radiation and exposed to ozone.

8. The organic EL display device fabrication system according to claim 2, wherein in said loading chamber said substrate is exposed to a reduced-pressure ozone atmosphere.

9. The organic EL display device fabrication system according to claim 1, wherein at least one of said film formation chambers is a vacuum evaporation chamber.

10. The organic EL display device fabrication system according to claim 1, wherein at least one of said film formation chambers is a sputtering chamber.

11. An organic EL display device fabrication process using an organic EL display device fabrication system comprising a loading side normal-pressure delivery chamber including a first substrate delivery means for delivering a substrate with no film formed thereon, a loading chamber connected thereto for introducing said substrate from said loading side normal-pressure delivery chamber at normal pressure into a vacuum delivery chamber at a vacuum, said vacuum delivery chamber being connected to said loading chamber and including a second substrate delivery means for delivering said substrate in a vacuum, and having one or two or more film formation chambers connected thereto, an unloading chamber connected thereto for delivering said substrate out of said vacuum delivery chamber at a vacuum into an unloading side normal-pressure delivery chamber at normal pressure, and said unloading side normal-pressure delivery chamber being connected to said unloading chamber and including a third substrate delivery means for delivering a substrate with films formed thereon, wherein:
    said substrate is delivered from said vacuum delivery chamber while an inert gas atmosphere having a moisture content of up to 100 ppm is maintained in said unloading chamber and said unloading side normal-pressure delivery chamber, both at normal pressure.

12. The organic EL display device fabrication process according to claim 11, wherein said organic EL display device fabrication system further comprises a loading side accommodation chamber connected to said loading side normal-pressure delivery chamber for accommodating a plurality of substrates with no film formed thereon at normal pressure, and an unloading side accommodation chamber connected to said unloading side normal-pressure delivery chamber for accommodating a plurality of substrates with films formed hereon at normal pressure, and
    said substrates with films formed thereon are accommodated in said unloading side accommodation chamber while an inert gas atmosphere having a moisture content of up to 100 ppm is maintained in said unloading side accommodation chamber.

13. The organic EL display device fabrication process according to claim 12, wherein said organic EL display device fabrication system further comprises an airtight working chamber connectable to said unloading side accommodation chamber or said unloading side normal-pressure delivery chamber, and sealing is carried out while an inert gas atmosphere having a moisture content of up to 100 ppm is maintained in said airtight working chamber.

14. The organic EL display device fabrication process according to claim 12, wherein said organic EL display device fabrication system further comprises a movable airtight chamber connectable to said unloading side accommodation chamber or said unloading side normal-pressure delivery chamber, and an inert gas atmosphere having a moisture content of up to 100 ppm is maintained in said movable airtight chamber, and said movable airtight chamber is detached from said normal-pressure delivery chamber while said inert gas atmosphere having a moisture content of up to 100 ppm is maintained, so that said movable airtight chamber can be connected to airtight working chamber for delivery of said substrates with films formed hereon.

15. The organic EL display device fabrication process according to claim 12, wherein said organic EL display device fabrication system has an unloading side accommodation chamber as a movable airtight chamber, and said movable airtight chamber is detached from said normal-pressure delivery chamber while an inert gas atmosphere having a moisture content of up to 100 ppm is maintained therein, so that said movable airtight chamber can be connected to airtight corking chamber for delivery of said substrates with films formed thereon.

16. The organic EL display device fabrication process according to claim 12, wherein in said loading side accommodation chamber, a plurality of substrates with no film formed thereon are simultaneously heated, followed by film formation.

17. The organic EL display device fabrication process according to claim 16, wherein before charged in said loading side accommodation chamber, said substrates are irradiated with ultraviolet radiation.

18. The organic EL display device fabrication process according to claim 11, wherein said organic EL display device fabrication system further comprises a cleaning chamber connected to said loading side normal-pressure delivery chamber for cleaning said substrate at normal pressure, in which cleaning chamber said substrate is irradiated with ultraviolet radiation and exposed to ozone, followed by film formation.

19. The organic EL display device fabrication process according to claim 11, wherein in said loading chamber, said substrate is exposed to a reduced-pressure ozone atmosphere.

20. The organic EL display device fabrication process according to claim 11, wherein in at least one of said film formation chambers, vacuum evaporation is carried out.

21. The organic EL display device fabrication process according to claim 11, wherein in at least one of said film formation chambers, sputtering is carried out.

* * * * *

UNITED STATES PATENT AND TRADEMARK OFFICE
CERTIFICATE OF CORRECTION

PATENT NO. : 6,132,280

DATED : October 17, 2000

INVENTOR(S): Hiroshi Tanabe et al.

It is certified that error appears in the above-identified patent and that said Letters Patent is hereby corrected as shown below:

Claim 15, line 9, change "corking" to --working--.

Signed and Sealed this

Fifteenth Day of May, 2001

Attest:

NICHOLAS P. GODICI

Attesting Officer    Acting Director of the United States Patent and Trademark Office